United States Patent
Negley

(10) Patent No.: US 7,718,991 B2
(45) Date of Patent: May 18, 2010

(54) LIGHTING DEVICE AND METHOD OF MAKING

(75) Inventor: Gerald H. Negley, Durham, NC (US)

(73) Assignee: Cree LED Lighting Solutions, Inc., Durham, NC (US)

( * ) Notice: Subject to any disclaimer, the term of this patent is extended or adjusted under 35 U.S.C. 154(b) by 0 days.

(21) Appl. No.: 11/751,990

(22) Filed: May 22, 2007

(65) Prior Publication Data

US 2007/0274063 A1 Nov. 29, 2007

Related U.S. Application Data

(60) Provisional application No. 60/802,697, filed on May 23, 2006.

(51) Int. Cl.
H01L 31/00 (2006.01)
H01L 21/00 (2006.01)
F21V 33/00 (2006.01)
F21V 7/04 (2006.01)

(52) U.S. Cl. .......................... 257/13; 257/99; 257/100; 257/E33.072; 257/E33.075; 438/22; 438/24; 362/84; 362/609

(58) Field of Classification Search ............... 362/84, 362/609; 257/13, 99, E33.072, E33.075; 267/100; 438/22, 24
See application file for complete search history.

(56) References Cited

U.S. PATENT DOCUMENTS

| | | | |
|---|---|---|---|
| 4,152,618 A | 5/1979 | Abe et al. | |
| 4,154,219 A | 5/1979 | Gupta et al. | |
| 4,168,102 A | 9/1979 | Chida et al. | |
| 4,545,366 A | 10/1985 | O'Neill | |
| 4,711,972 A | 12/1987 | O'Neill | |
| 4,843,280 A | 6/1989 | Lumbard et al. | |
| 4,918,497 A | 4/1990 | Edmond | |
| 4,966,862 A | 10/1990 | Edmond | |
| 5,027,168 A | 6/1991 | Edmond | |
| 5,210,051 A | 5/1993 | Carter, Jr. | |

(Continued)

FOREIGN PATENT DOCUMENTS

EP    0 961 525    12/1999

(Continued)

OTHER PUBLICATIONS

U.S. Appl. No. 11/613,692, filed Dec. 20, 2006.

(Continued)

*Primary Examiner*—Long K Tran
(74) *Attorney, Agent, or Firm*—Burr & Brown

(57) ABSTRACT

A lighting device comprises a solid state light emitter, first and second electrodes connected to the emitter, an encapsulant region comprising a silicone compound and a supporting region. The encapsulant region extends to an external surface of the lighting device. At least a portion of the first electrode is surrounded by the supporting region. The encapsulant region and the supporting region together define an outer surface which substantially encompasses the emitter. A method of making a lighting device, comprises electrically connecting first and second electrodes to an emitter; inserting the emitter into mold cavity; inserting an encapsulant composition comprising a one silicone compound; and then inserting a second composition to substantially surround at least a portion of the first electrode.

18 Claims, 2 Drawing Sheets

U.S. PATENT DOCUMENTS

| | | |
|---|---|---|
| 5,277,840 A | 1/1994 | Osaka et al. |
| 5,338,944 A | 8/1994 | Edmond et al. |
| 5,338,994 A | 8/1994 | Lezan et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,813,753 A | 9/1998 | Vriens et al. |
| 5,858,278 A | 1/1999 | Itoh et al. |
| 5,912,477 A | 6/1999 | Negley |
| 5,959,316 A | 9/1999 | Lowery |
| 5,998,925 A | 12/1999 | Shimizu et al. |
| 6,031,179 A | 2/2000 | O'Neill |
| 6,069,440 A | 5/2000 | Shimizu et al. |
| 6,075,200 A | 6/2000 | O'Neill |
| 6,077,724 A | 6/2000 | Chen |
| 6,120,600 A | 9/2000 | Edmond et al. |
| 6,132,072 A | 10/2000 | Turnbull et al. |
| 6,187,606 B1 | 2/2001 | Edmond et al. |
| 6,201,262 B1 | 3/2001 | Edmond et al. |
| 6,204,523 B1 | 3/2001 | Carey et al. |
| 6,245,259 B1 | 6/2001 | Hohn et al. |
| 6,252,254 B1 | 6/2001 | Soules et al. |
| 6,274,924 B1 | 8/2001 | Carey et al. |
| 6,297,598 B1 | 10/2001 | Wang et al. |
| 6,483,196 B1 | 11/2002 | Wojnarowski et al. |
| 6,518,600 B1 * | 2/2003 | Shaddock ................. 257/98 |
| 6,521,916 B2 | 2/2003 | Roberts et al. |
| 6,635,363 B1 | 10/2003 | Duclos et al. |
| 6,717,362 B1 | 4/2004 | Lee et al. |
| 6,730,939 B2 | 5/2004 | Eisert et al. |
| 6,747,406 B1 | 6/2004 | Bortscheller et al. |
| 6,853,010 B2 | 2/2005 | Slater, Jr. et al. |
| 6,921,926 B2 | 7/2005 | Hsu |
| 7,029,935 B2 | 4/2006 | Negley et al. |
| 7,116,308 B1 | 10/2006 | Heeks et al. |
| 7,126,274 B2 | 10/2006 | Shimizu et al. |
| 7,183,587 B2 | 2/2007 | Negley et al. |
| 7,215,074 B2 | 5/2007 | Shimizu et al. |
| 7,264,378 B2 | 9/2007 | Loh et al. |
| 7,355,284 B2 | 4/2008 | Negley |
| 7,358,542 B2 * | 4/2008 | Radkov et al. ................. 257/98 |
| 2001/0042858 A1 | 11/2001 | Ishinaga |
| 2002/0088987 A1 | 7/2002 | Sakurai |
| 2002/0123164 A1 | 9/2002 | Slater, Jr. et al. |
| 2002/0149576 A1 | 10/2002 | Tanaka et al. |
| 2002/0187260 A1 | 12/2002 | Sheppard et al. |
| 2003/0006418 A1 | 1/2003 | Emerson et al. |
| 2003/0054184 A1 | 3/2003 | Miyadera et al. |
| 2003/0117068 A1 | 6/2003 | Forrest et al. |
| 2003/0122482 A1 | 7/2003 | Yamanaka et al. |
| 2003/0168670 A1 * | 9/2003 | Roberts et al. ................. 257/98 |
| 2003/0209714 A1 | 11/2003 | Taskar et al. |
| 2004/0004434 A1 | 1/2004 | Nishi et al. |
| 2004/0041222 A1 | 3/2004 | Loh |
| 2004/0056260 A1 | 3/2004 | Slater, Jr. et al. |
| 2004/0072106 A1 | 4/2004 | Chua et al. |
| 2004/0079957 A1 | 4/2004 | Andrews et al. |
| 2004/0126913 A1 | 7/2004 | Loh et al. |
| 2004/0130912 A1 | 7/2004 | Miyashita |
| 2004/0264212 A1 | 12/2004 | Chung et al. |
| 2005/0007306 A1 | 1/2005 | Iisaka et al. |
| 2005/0062140 A1 | 3/2005 | Leung et al. |
| 2005/0269587 A1 | 12/2005 | Loh et al. |
| 2005/0270666 A1 | 12/2005 | Loh et al. |
| 2006/0105485 A1 | 5/2006 | Basin et al. |
| 2006/0292747 A1 | 12/2006 | Loh et al. |
| 2007/0057268 A1 | 3/2007 | Hamanaka et al. |

FOREIGN PATENT DOCUMENTS

| | | |
|---|---|---|
| JP | 57-076885 | 5/1982 |
| JP | 08-116094 | 5/1996 |
| JP | 11-251638 | 9/1999 |
| JP | 2003-318448 | 11/2003 |
| JP | 2003/0318448 | 11/2003 |
| WO | 99/03087 | 1/1999 |
| WO | 03/007663 | 1/2003 |

OTHER PUBLICATIONS

U.S. Appl. No. 11/788,001, filed Apr. 18, 2007.
U.S. Appl. No. 11/705,233, filed Feb. 12, 2007.
U.S. Appl. No. 11/705,305, filed Feb. 12, 2007.
U.S. Appl. No. 11/507,191, filed Aug. 21, 2006.
U.S. Appl. No. 10/818,912, filed Apr. 6, 2004.

* cited by examiner

LIGHTING DEVICE AND METHOD OF MAKING

CROSS-REFERENCE TO RELATED APPLICATIONS

This application claims the benefit of U.S. Provisional Patent Application No. 60/802,697, filed May 23, 2006, the entirety of which is incorporated herein by reference.

FIELD OF THE INVENTION

The present invention relates to a lighting device, in particular, a device which includes one or more solid state light emitters. The present invention also relates to a method of making a lighting device, in particular, a device which includes one or more solid state light emitters.

BACKGROUND OF THE INVENTION

A large proportion (some estimates are as high as twenty-five percent) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient as compared to solid state light emitters, such as light emitting diodes.

In addition, as compared to the normal lifetimes of solid state light emitters, e.g., light emitting diodes, incandescent light bulbs have relatively short lifetimes, i.e., typically about 750-1000 hours. In comparison, light emitting diodes, for example, have typical lifetimes between 50,000 and 70,000 hours. Fluorescent bulbs have longer lifetimes (e.g., 10,000-20,000 hours) than incandescent lights, but provide less favorable color reproduction.

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which light emitting diodes and other solid state light emitters can be used in place of incandescent lights, fluorescent lights and other light-generating devices in a wide variety of applications. In addition, where light emitting diodes (or other solid state light emitters) are already being used, efforts are ongoing to provide light emitting diodes (or other solid state light emitters) which are improved, e.g., with respect to energy efficiency, color rendering index (CRI Ra), contrast, efficacy (lm/W), cost, and/or duration of service.

A variety of solid state light emitters are well-known. For example, one type of solid state light emitter is a light emitting diode. Light emitting diodes are well-known semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present invention can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Because light that is perceived as white is necessarily a blend of light of two or more colors (or wavelengths), no single light emitting diode junction has been developed that can produce white light. "White" LED lamps have been produced which have a light emitting diode pixel formed of respective red, green and blue light emitting diodes. Another "white" LED lamp which has been produced includes (1) a light emitting diode which generates blue light and (2) a luminescent material (e.g., a phosphor) that emits yellow light in response to excitation by light emitted by the light emitting diode, whereby the blue light and the yellow light, when mixed, produce light that is perceived as white light.

Light emitting diodes can thus be used individually or in any combinations, optionally together with one or more luminescent material (e.g., phosphors or scintillators) and/or filters, to generate light of any desired perceived color (including white). Accordingly, the areas in which efforts are being made to replace existing light sources with light emitting diode light sources, e.g., to improve energy efficiency, color rendering index (CRI Ra), efficacy (lm/W), and/or duration of service, are not limited to any particular color or color blends of light.

A wide variety of luminescent materials (also known as lumiphors or luminophoric media, e.g., as disclosed in U.S. Pat. No. 6,600,175, the entirety of which is hereby incorporated by reference) are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished by adding the luminescent materials to a clear or substantially transparent encapsulant material (e.g., epoxy-based, silicone-based, glass-based or metal oxide-based material) as discussed above, for example by a blending or coating process.

For example, U.S. Pat. No. 6,963,166 (Yano '166) discloses that a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. According to Yano '166, the first resin portion is obtained by filling the cup reflector with a resin material and curing it after the light emitting diode chip has been mounted onto the bottom of the cup reflector and then has had its cathode and anode electrodes electrically connected to the leads by way of wires. According to Yano '166, a phosphor is dispersed in the first resin portion so as to be excited with the light A that has been emitted from the light emitting diode chip, the excited phosphor produces fluorescence ("light B") that has a longer wavelength than the light A, a portion of the light A is transmitted through the first resin portion including the phosphor, and as a result, light C, as a mixture of the light A and light B, is used as illumination.

Although the development of light emitting diodes has in many ways revolutionized the lighting industry, some of the characteristics of light emitting diodes have presented challenges, some of which have not yet been fully met. For example, as flux densities and flux energies of LEDs have increased dramatically, it has been seen that many standard LED encapsulation materials (e.g., optically clear epoxy) optically degrades (e.g., turns yellow, brown or black). This optical degradation has been seen to be caused by high flux density and/or high flux energy, and has been seen to be exacerbated by high temperatures.

There is an ongoing need for ways to use light emitting diodes in a wider variety of applications, with greater energy efficiency, with improved color rendering index (CRI Ra), with improved efficacy (lm/W), and/or with longer duration of service.

BRIEF SUMMARY OF THE INVENTION

It is well-known that packaged solid state lighting devices, e.g., packaged LEDs, have a tendency to optically degrade over time, especially when the sources of light within the lighting devices emit high flux densities and/or flux densities of comparatively higher energy photons (e.g., blue light).

It has been found that lighting devices as described herein exhibit significantly reduced optical degradation in comparison with conventional solid state lighting devices with comparable light output and intensity, while maintaining excellent mechanical integrity and reliability.

In a first aspect of the present invention, there is provided a lighting device, comprising:

at least one solid state light emitter;

at least a first electrode and a second electrode, the first electrode and the second electrode each being electrically connected to the solid state light emitter;

at least one encapsulant region comprising at least one silicone compound, the encapsulant region extending to an external surface of the lighting device;

at least one supporting region, at least a portion of the first electrode being surrounded by the supporting region;

the at least one encapsulant region and the at least one supporting region together defining a lighting device outer surface which substantially encompasses the solid state light emitter.

A statement herein that two components in a device are "electrically connected," means that there are no components electrically between the components, the insertion of which materially affect the function or functions provided by the device. For example, two components can be referred to as being electrically connected, even though they may have a small resistor between them which does not materially affect the function or functions provided by the device (indeed, a wire connecting two components can be thought of as a small resistor); likewise, two components can be referred to as being electrically connected, even though they may have an additional electrical component between them which allows the device to perform an additional function, while not materially affecting the function or functions provided by a device which is identical except for not including the additional component; similarly, two components which are directly connected to each other, or which are directly connected to opposite ends of a wire or a trace on a circuit board or another medium, are electrically connected.

In some embodiments according to the present invention, the lighting device further comprises at least one luminescence region which comprises at least one luminescent material.

In some embodiments according to the present invention, the lighting device further comprises a reflective element in which the solid state light emitter is mounted. In some of such embodiments, the lighting device further comprises at least one luminescence region positioned inside the reflective element.

In a second aspect of the present invention, there is provided a method of making a lighting device, comprising:

electrically connecting at least first and second electrodes to a solid state light emitter to form a light emitter element;

inserting the light emitter element into a region located within a space defined by a mold cavity;

inserting into a first portion of the space an encapsulant composition comprising at least one silicone compound; and then inserting into a second portion of the space a supporting region forming composition, whereby the supporting region forming composition substantially surrounds at least a portion of the first electrode, whereby at least a portion of the outer surface of the at least one encapsulant composition and at least a portion of the outer surface of the at least one supporting region forming composition together define a combined encapsulant-supporting region outer surface which substantially encompasses the solid state light emitter.

In some embodiments according to the second aspect of the present invention, the first and second electrodes are electrically connected to the solid state light emitter before the light emitter element is inserted into the region located within the space defined by the mold cavity.

In some embodiments according to the second aspect of the present invention, the light emitter element is inserted into the region located within the space defined by the mold cavity before the encapsulant composition is inserted into the first portion of the space.

In some embodiments according to the second aspect of the present invention, the method further comprises at least partially curing the encapsulant composition before the inserting the supporting region forming composition into the second portion of the space.

The invention may be more fully understood with reference to the accompanying drawings and the following detailed description of the invention.

BRIEF DESCRIPTION OF THE DRAWING FIGURES

DETAILED DESCRIPTION OF THE INVENTION

Figure 1:
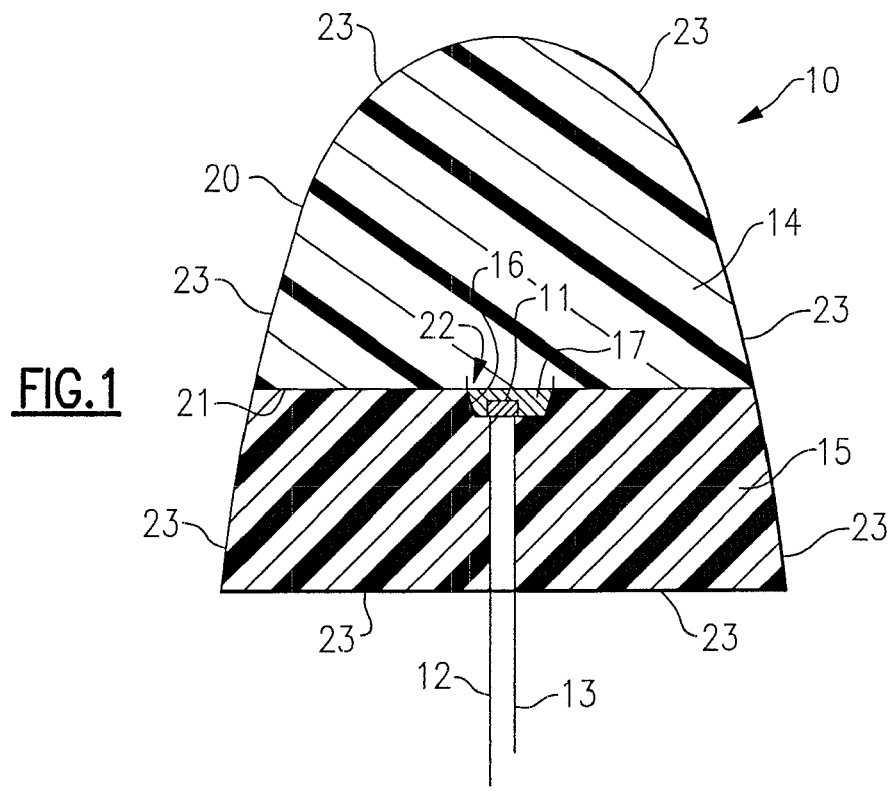
FIG. 1 depicts a first embodiment of a lighting device according to the present invention.

As noted above, in a first aspect of the present invention, there is provided a lighting device comprising at least one solid state light emitter, at least a first electrode and a second electrode, at least one encapsulant region comprising at least one silicone compound, and at least one supporting region.

The lighting device can include a single solid state light emitter or a plurality of solid state light emitters. Where the lighting device includes a plurality of solid state light emitters, the respective light emitters can be similar to one another, different from one another or any combination (i.e., there can be a plurality of solid state light emitters of one type, or one or more solid state light emitters of each of two or more types), and the light emitters can be in one or more clusters or can be separated from one another, or one or more can be separated from the others and there can be one or more clusters each having two or more light emitters.

Any desired solid state light emitter or emitters can be employed in accordance with the present invention. Persons of skill in the art are aware of, and have ready access to, a wide variety of such emitters. Such solid state light emitters include inorganic and organic light emitters. Examples of types of such light emitters include light emitting diodes (inorganic or organic), laser diodes, thin film electroluminescent devices, light emitting polymers (LEPs), and polymer light emitting diodes (PLEDs), a variety of each of which are well-known in the art. Because these various solid state light emitters are well-known in the art, it is not necessary to describe them in detail, nor is it necessary to describe the materials out of which such devices are made.

As noted above, one type of solid state light emitter which can be employed are LEDs. Such LEDs can be selected from among any light emitting diodes (a wide variety of which are readily obtainable and well known to those skilled in the art, and therefore it is not necessary to describe in detail such devices, and/or the materials out of which such devices are made). For instance, examples of types of light emitting diodes include inorganic and organic light emitting diodes, a variety of each of which are well-known in the art.

The first and second electrodes can be independently selected from among any of the wide variety of well-known types of electrodes for LEDs. Persons of skill in the art are aware of, and have ready access to, a wide variety of such electrodes.

The at least one silicone compound for the at least one encapsulant region can be selected from among any silicone materials, a wide variety of which are well-known. In some embodiments, the at least one encapsulant region is formed of optical clarity silicone and/or transmits at least 95% of the light (of the wavelength or within the range of wavelengths emitted by the one or more solid state light emitter and any luminescent material) that enters the encapsulant region, a number of such silicone materials being known to persons skilled in the art. A representative example of a suitable silicone material is General Electric's RTV 615. Any of a wide variety of additives can be included in the encapsulant composition to provide any of a wide variety of properties, e.g., increased index of refraction (for example, phenol-based additives can be used to boost the refractive index of the at least one silicone compound; likewise, $TiO_2$ or other "high index" nanoparticles can be added to boost the refractive index of the at least one silicone compound.

All other things being equal, greater light extraction from the solid state light emitters can be obtained where the encapsulant region has a higher index of refraction. In some embodiments of the present invention, the encapsulant region comprises, consists essentially of or consists of a silicone material having an index of refraction of at least 1.41, at least 1.5, at least 1.75, at least 1.8 or at least 2.2.

Such silicone materials include optical gel (a silicone material which is not fully cross-linked, such that it is viscoelastic, i.e., if it is cut with a knife, it will "self-heal").

In addition, such silicone materials include silicone-epoxy mixtures and sol-gel epoxy mixtures.

A number of representative silicone materials are described in Jacqueline I. Kraschwitz, Herman F. Mark, et al., "Encyclopedia of Polymer Science and Engineering" (2d ed.), New York: Wiley & Sons, (1985), vol. 15 (e.g., see the chapter entitled "Silicone"). Additionally, representative silicone materials can be found in "Silicone Material Solutions for LED Packages and Assemblies" from General Electric.

The material out of which the at least one supporting region is formed can be selected from among any desired material. In some embodiments, the at least one supporting region is substantially optically clear. One representative example of a group of suitable materials that the supporting region can comprise is epoxy materials, e.g., the Hysol™ group of epoxies.

The expressions "substantially optically clear" and "substantially transparent", as used herein, mean that the structure which is characterized as being substantially optically clear or substantially transparent allows passage of at least 90% of light having a wavelength within the range emitted by the solid state light emitter.

In some embodiments, the at least one supporting region comprises material having a high index of refraction, e.g., at least about 1.5, at least about 1.75, at least about 2.0 or at least about 2.2.

In some embodiments, at least 50% of the light emitted from the at least one solid state light emitter in the lighting device does not enter the at least one supporting region, i.e., it passes out of the lighting device through the encapsulant region.

In some embodiments according to the present invention, the lighting device further comprises at least one luminescence region which comprises at least one luminescent material. The one or more luminescent materials, when provided, can be in any desired form and can be selected from among phosphors, scintillators, day glow tapes, inks which glow in the visible spectrum upon illumination with ultraviolet light, etc. The luminescent element can, if desired, be embedded in a resin (i.e., a polymeric matrix), such as a silicone material, an epoxy, a glass or a metal oxide material.

The expression "lumiphor", as used herein, refers to any luminescent element, i.e., any element which includes a luminescent material, a variety of which are readily available and well-known to those skilled in the art.

The one or more lumiphors can individually be any lumiphor, a wide variety of which, as noted above, are known to those skilled in the art. For example, the or each lumiphor can comprise (or can consist essentially of, or can consist of) one or more phosphor. The or each of the one or more lumiphors can, if desired, further comprise (or consist essentially of, or consist of) one or more highly transmissive (e.g., transparent or substantially transparent, or somewhat diffuse) binder, e.g., made of epoxy, silicone, glass, metal oxide or any other suitable material (for example, in any given lumiphor comprising one or more binder, one or more phosphor can be dispersed within the one or more binder). For example, the thicker the lumiphor, in general, the lower the weight percentage of the phosphor can be. Representative examples of the weight percentage of phosphor include from about 3.3 weight percent up to about 20 weight percent, although, as indicated above, depending on the overall thickness of the lumiphor, the weight percentage of the phosphor could be generally any value, e.g., from 0.1 weight percent to 100 weight percent (e.g., a lumiphor formed by subjecting pure phosphor to a hot isostatic pressing procedure).

Devices in which a lumiphor is provided can, if desired, further comprise one or more clear encapsulant (comprising, e.g., one or more silicone materials) positioned between the solid state light emitter (e.g., light emitting diode) and the lumiphor.

The or each of the one or more lumiphors can, independently, further comprise any of a number of well-known additives, e.g., diffusers, scatterer's, tints, etc.

In some embodiments according to the present invention, the lighting device further comprises a reflective element, and the one or more solid state light emitter is mounted in said reflective element. In some such embodiments, the lighting device further comprises at least one luminescence region positioned inside said reflective element, the luminescence region comprising at least one luminescent material. In some such embodiments, the luminescence region is in contact with the one or more solid state light emitter. In some embodiments according to the present invention, where a reflective element is provided, the reflective element can be integral with one of the electrodes.

In some embodiments according to the first aspect of the present invention, the lighting device is shaped and sized so as to correspond with the shape and size of conventional lighting devices, e.g., currently, 5 mm LED packages, 3 mm LED packages and 10 mm LED packages, the sizes and shapes of which are well-known to those skilled in the art.

One or more brightness enhancement films can optionally further be included in the lighting devices according to this aspect of the present invention. Such films are well-known in the art and are readily available. Brightness enhancement films (e.g., BEF films commercially available from 3M) are optional—when employed, they provide a more directional light source by limiting the acceptance angle. Light not "accepted" is recycled by the highly reflective light source enclosure. Preferably, the brightness enhancement films (which can optionally be replaced by one or more extraction films, such as by WFT), if employed, are optimized to limit the viewing angle of the emitted source and to increase the probability of extracting light on the first (or earliest possible) pass.

In addition, one or more scattering layers can optionally be included in the lighting devices according to this aspect of the present invention. The scattering layer can be included in the phosphor layer, and/or a separate scattering layer can be provided. A wide variety of separate scattering layers and combined luminescent and scattering layers are well known to those of skill in the art, and any such layers can be employed in the lighting devices of the present invention.

As noted above, according to the second aspect of the present invention, there is provided a method of making a lighting device, comprising:

electrically connecting at least first and second electrodes to a solid state light emitter to form a light emitter element;

inserting the light emitter element into a region located within a space defined by a mold cavity;

inserting into a first portion of the space an encapsulant composition comprising at least one silicone compound; and then inserting into a second portion of the space a supporting region forming composition, whereby the supporting region forming composition substantially surrounds at least a portion of the first electrode, whereby at least a portion of an outer surface of the at least one encapsulant composition and at least a portion of an outer surface of the at least one supporting region forming composition together define a combined encapsulant-supporting region outer surface which substantially encompasses the solid state light emitter.

The expression "substantially surround", as used herein, means that the supporting region which substantially surrounds an electrode covers in at least two dimensions at least 95% of at least a portion of the electrode (with or without space between the supporting region and the electrode), i.e., a portion of the electrode is exposed (not covered by the supporting region), if at all, over not more than 5% of its surface area.

The expression "substantially encompass", as used herein, means that the outer surface of the structure (the encompassing structure) which substantially encompasses the solid state light emitter covers in all three dimensions at least 95% of the surface of the solid state light emitter (with or without space between the encompassing structure and the solid state light emitter), i.e., the solid state light emitter is exposed (not covered by the encompassing structure), if at all, over not more than 5% of its surface area.

The steps of (1) electrically connecting at least first and second electrodes to the solid state light emitter, (2) inserting the light emitter element into a region located within the space defined by the mold cavity, and (3) inserting into the first portion of the space an encapsulant composition comprising at least one silicone compound can be carried out in any order.

The encapsulant can be inserted into a first portion of the space in any desired way, and persons of skill in the art can readily select a suitable method for inserting the encapsulant from a wide variety of well-known possible methods.

In some embodiments of the second aspect of the present invention, the encapsulant is at least partially cured before inserting the supporting region forming composition into the second portion of the space.

The supporting region forming composition can be inserted into the second portion of the space in any desired way, and persons of skill in the art can readily select a suitable method for inserting the supporting region forming composition from a wide variety of well-known possible methods.

In some embodiments of the second aspect of the present invention, the supporting region forming composition comprises at least one epoxy compound.

The lighting devices of the present invention can be arranged, mounted and supplied with electricity in any desired manner, and can be mounted on any desired housing or fixture. Skilled artisans are familiar with a wide variety of arrangements, mounting schemes, power supplying apparatuses, housings and fixtures, and any such arrangements, schemes, apparatuses, housings and fixtures can be employed in connection with the present invention. The lighting devices of the present invention can be electrically connected (or selectively connected) to any desired power source, persons of skill in the art being familiar with a variety of such power sources.

Representative examples of arrangements of lighting devices, schemes for mounting lighting devices, apparatus for supplying electricity to lighting devices, housings for lighting devices, fixtures for lighting devices and power supplies for lighting devices, all of which are suitable for the lighting devices of the present invention, are described in U.S. patent application Ser. No. 60/752,753, filed on Dec. 21, 2005, entitled "Lighting Device" (inventors: Gerald H. Negley, Antony Paul Van de Ven and Neal Hunter), the entirety of which is hereby incorporated by reference.

The devices according to the present invention can further comprise one or more long-life cooling device (e.g., a fan with an extremely high lifetime). Such long-life cooling device(s) can comprise piezoelectric or magnetorestrictive materials (e.g., MR, GMR, and/or HMR materials) that move air as a "Chinese fan". In cooling the devices according to the present invention, typically only enough air to break the boundary layer is required to induce temperature drops of 10 to 15 degrees C. Hence, in such cases, strong 'breezes" or a large fluid flow rate (large CFM) are typically not required (thereby avoiding the need for conventional fans).

The devices according to the present invention can further comprise secondary optics to further change the projected nature of the emitted light. Such secondary optics are well-known to those skilled in the art, and so they do not need to be described in detail herein—any such secondary optics can, if desired, be employed.

The devices according to the present invention can further comprise sensors or charging devices or cameras, etc. For example, persons of skill in the art are familiar with, and have ready access to, devices which detect one or more occurrence (e.g., motion detectors, which detect motion of an object or person), and which, in response to such detection, trigger illumination of a light, activation of a security camera, etc. As a representative example, a device according to the present invention can include a lighting device according to the present invention and a motion sensor, and can be constructed such that (1) while the light is illuminated, if the motion sensor detects movement, a security camera is activated to record visual data at or around the location of the detected motion, or (2) if the motion sensor detects movement, the light is illuminated to light the region near the location of the detected motion and the security camera is activated to record visual data at or around the location of the detected motion, etc.

FIG. 1 depicts a first embodiment of a lighting device in accordance with the first aspect of the present invention. Referring to FIG. 1, there is shown a lighting device 10 comprising a solid state light emitter 11 (in this case, a light emitting diode chip 11), a first electrode 12, a second electrode 13, an encapsulant region 14, a supporting region 15, a reflective element 16 in which the light emitting diode chip 11 is mounted and a lumiphor 17. In this embodiment, the encapsulant region 14 comprises a silicone material and the supporting region 15 comprises an epoxy material.

In this embodiment, the first electrode 12 and the second electrode 13 are each electrically connected to the solid state light emitter 11. A portion of the first electrode 12 and a portion of the second electrode 13 are surrounded by the supporting region 15.

In this embodiment, the encapsulant region 14 extends to an external surface 20 of the lighting device 10. The encapsulant region 14 and the supporting region 15 abut one another along a plane 21 which is adjacent to an upper lip 22 of the reflective element 16. The encapsulant region 14 and the supporting region 15 together define a lighting device outer surface 23 which substantially encompasses the solid state light emitter 11. As is well known, in this embodiment, the outer surface of the lighting device is curved in order to reduce the amount of reflection of light exiting from the outer surface of the lighting device.

The lumiphor 17 is positioned inside the reflective element 16 and is in contact with the light emitting diode chip 11.

The lighting device 10 shown in FIG. 1 is intended to have the same relative size and shape as a conventional 5 mm/T-13/4 LED device or 3 mm T-1 device, and accordingly, the supporting region 15 includes a lower rim (not shown) and a flat side (not shown), which facilitate registration of the radiation emitter device by an auto inserter.

The following is a description of an embodiment according to the second aspect of the present invention, for making a lighting device.

The first step in the method of this embodiment is to prepare a lead frame. The lead frame may be made in any conventional configuration using any conventional techniques. The lead frame is preferably made of metal and may be stamped and optionally post-plated. The lead frame may also undergo optional ultrasonic or other cleaning. The lead frame includes the first and second electrodes and reflective elements ("cups") for a plurality of solid state light emitters. The reflective elements may be polished or plated to increase their reflectivity.

The next step in the method of this embodiment is to attach one or more solid state light emitters to each reflective cup on the lead frame.

If desired, an optional phosphor 29, glob-top, or other optical or physical moderator can then be deposited on one or more of the solid state light emitters.

Figure 2:
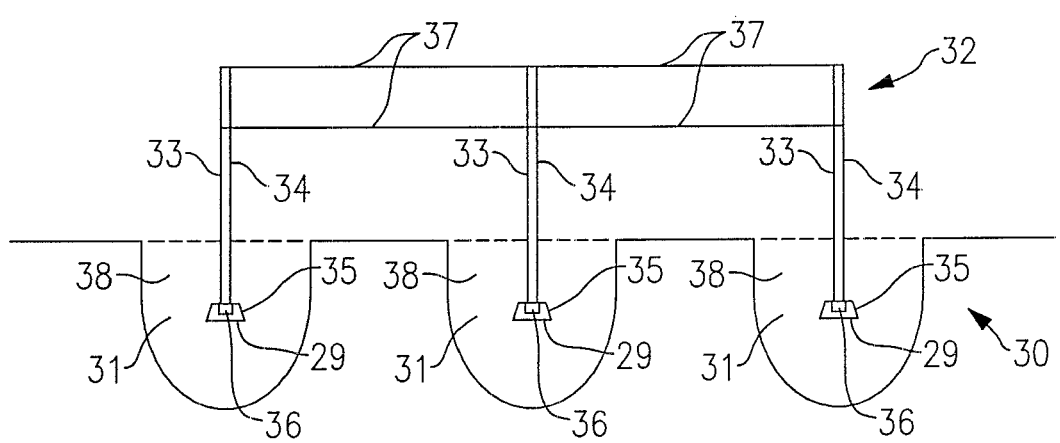
FIG. 2 is a schematic illustration of a lead frame and mold in a stage of a method according to an embodiment of a method of making a lighting device according to the present invention.

Next, in this embodiment, the lead frame subassembly is inverted and register portions of the lead frame subassembly are inserted into mold cavities formed in a mold. FIG. 2 depicts a mold 30 having three mold cavities 31 (the mold can include any desired number of mold cavities), and a lead frame 32 which includes three sets of electrodes 33, 34, three reflective elements 35, three solid state light emitters 36 and tie bars 37 (any desired number of sets including electrodes, a reflective element and one or more solid state light emitters can be employed). Each mold cavity 31 defines a space 38.

Figure 3:
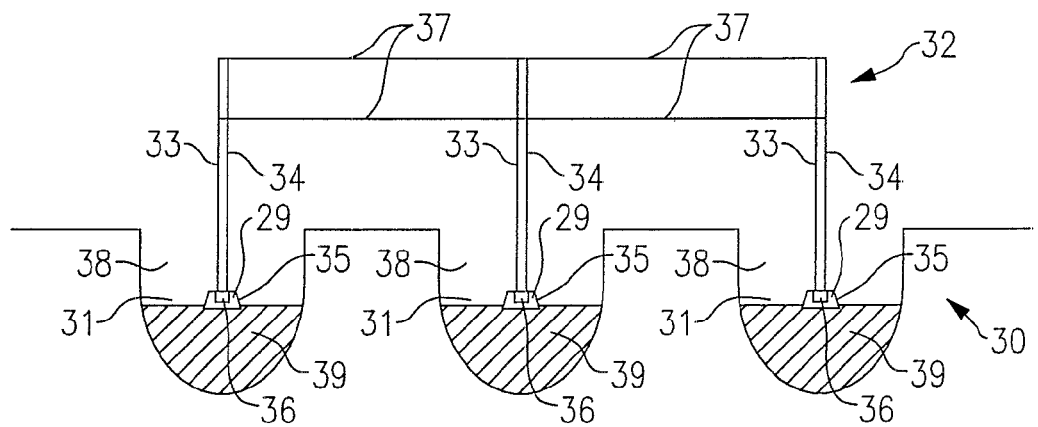
FIG. 3 is a schematic illustration of a lead frame and mold in a stage of a method according to an embodiment of a method of making a lighting device according to the present invention.

Next, an encapsulant composition 39 (see FIG. 3) is deposited (by any suitable method, e.g., injection) into a first portion of each space 38. Precise metering or feedback can, if desired, be used to fill the encapsulant composition just up to or over the inverted lip of the reflective elements 35 (or surfaces of the solid state light emitter 36, if there is no reflective element in the device). Optionally, a degas step can be performed to remove bubbles by vacuum from the encapsulant. Optionally, a step of precuring the encapsulant be performed, if desired. This optional precure may be, for example, just enough of a cure to minimize free mixing of the encapsulant composition with the supporting region forming composition, but also be not so much as to prevent some mixing. Some minor mixing in the boundary between the encapsulant and the supporting region may, in many instances, be beneficial for homogenous strength, cohesive bonding, etc.

Figure 4:
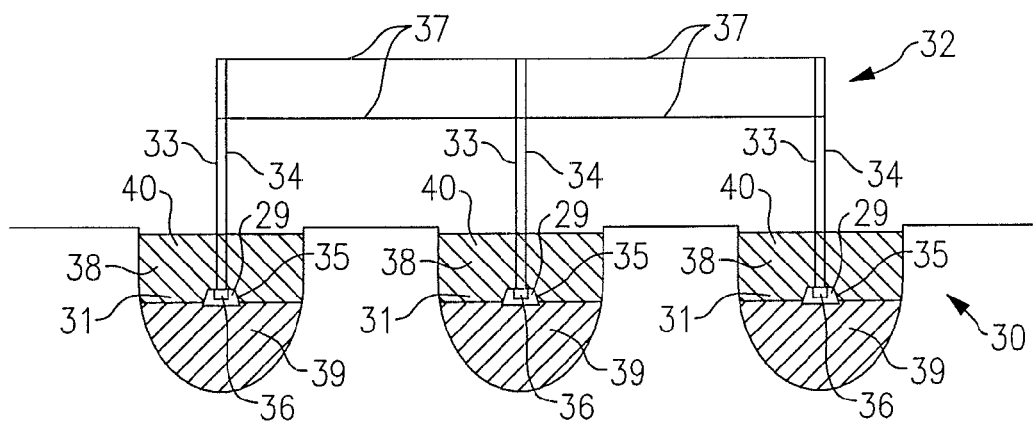
FIG. 4 is a schematic illustration of a lead frame and mold in a stage of a method according to an embodiment of a method of making a lighting device according to the present invention.

Next, the supporting region forming composition 39 (see FIG. 4) is deposited (by any suitable method, e.g., injection) into a second portion of each space 38. Precise metering or feedback can, if desired, be used to fill the encapsulant just up to the desired point (e.g., to the designed bottom of the device body or the top of standoffs on the electrodes).

Optionally, the supporting region forming composition 39 may then be degassed by vacuum to remove any bubbles.

Next, the supporting region forming composition is cured along with any residual curing of the encapsulant composition.

Next, the nearly finished lead frame structure is ejected from the mold 30. An optional post-cure step may then be performed followed by an optional cleaning/deflash step.

The next step is a singulation step, in which the tie bars 37 are cut away from the finished lead frame assembly Any two or more structural parts of the lighting devices described herein can be integrated. Any structural part of the lighting devices described herein can be provided in two or more parts (which are held together, if necessary). Similarly, any two or more functions can be conducted simultaneously, and/or any function can be conducted in a series of steps.

The invention claimed is:

1. A lighting device, comprising:
   at least one solid state light emitter;
   at least a first electrode and a second electrode, said first electrode and said second electrode each being electrically connected to said solid state light emitter;
   an encapsulant element that defines part of an outer surface of said lighting device, at least one region of said encapsulant element comprising at least one silicone compound and extending to said outer surface of said lighting device;
   at least one supporting region, at least a portion of said first electrode being surrounded by said supporting region; and
   a reflective element, said solid state light emitter being mounted on said reflective element,
   said encapsulant element and said at least one supporting region together defining said outer surface of said lighting device, said outer surface of said lighting device substantially encompassing said solid state light emitter.

2. A lighting device as recited in claim 1, wherein at least a portion of said second electrode is also surrounded by said supporting region.

3. A lighting device as recited in claim 1, further comprising at least one luminescence region, said luminescence region comprising at least one luminescent material, said luminescence region being positioned inside said reflective element.

4. A lighting device as recited in claim 1, wherein at least 50% of light emitted from said solid state light emitter does not enter said at least one supporting region.

5. A lighting device as recited in claim 1, wherein said supporting region comprises at least one epoxy compound.

6. A lighting device as recited in claim 1, further comprising at least one luminescence region, said luminescence region comprising at least one luminescent material.

7. A lighting device as recited in claim 6, wherein said luminescence region is in contact with said solid state light emitter.

8. A lighting device as recited in claim 1, wherein said solid state light emitter comprises a light emitting diode.

9. A method of making a lighting device, comprising:
   electrically connecting at least first and second electrodes to a solid state light emitter to form a light emitter element, said solid state light emitter being mounted on a reflective element;
   inserting said light emitter element into a region located within a space defined by a mold cavity;
   inserting into a first portion of said space an encapsulant composition comprising at least one silicone compound; and
   then inserting into a second portion of said space a supporting region forming composition, whereby said supporting region forming composition substantially surrounds at least a portion of said first electrode,
   whereby at least a portion of an outer surface of said at least one encapsulant composition and at least a portion of an outer surface of said at least one supporting region forming composition together define a combined encapsulant-supporting region outer surface which substantially encompasses said solid state light emitter.

10. A method as recited in claim 9, wherein at least a portion of said second electrode is also surrounded by said supporting region forming composition.

11. A method as recited in claim 9, wherein said electrically connecting said first and second electrodes to said solid state light emitter is performed before said inserting said light emitter element into said region located within said space defined by said mold cavity.

12. A method as recited in claim 9, wherein said inserting said light emitter element into said region located within said space defined by said mold cavity is performed before said inserting said encapsulant composition into said first portion of said space.

13. A method as recited in claim 9, further comprising at least partially curing said encapsulant composition before said inserting said supporting region forming composition into said second portion of said space.

14. A method as recited in claim 9, wherein said supporting region forming composition comprises at least one epoxy compound.

15. A lighting device as recited in claim 1, wherein:
   said reflective element comprises a reflective cup,
   said reflective cup has a lip portion,
   said encapsulant region and said supporting region abut each other substantially along a plane, and
   said plane is adjacent to said lip portion of said cup.

16. A lighting device as recited in claim 9, wherein:
   said reflective element comprises a reflective cup,
   said reflective cup has a lip portion,
   said encapsulant region and said supporting region abut each other substantially along a plane, and
   said plane is adjacent to said lip portion of said cup.

17. A lighting device, comprising:
   at least one solid state light emitter;
   at least a first electrode and a second electrode, said first electrode and said second electrode each being electrically connected to said solid state light emitter;
   an encapsulant element that defines part of an outer surface of said lighting device, at least one region of said encapsulant element comprising at least one silicone compound and extending to said outer surface of said lighting device;
   at least one supporting region, at least a portion of said first electrode being surrounded by said supporting region; and a cup comprising sidewalls extending to a lip portion, said solid state light emitter being mounted in said cup, said encapsulant element and said at least one supporting region together defining said outer surface of said lighting device, said outer surface said lighting device substantially encompassing said solid state light emitter, said encapsulant element and said supporting region abutting each other substantially along a plane, said plane being adjacent to said lip portion of said cup.

18. A lighting device as recited in claim 17, wherein said cup is reflective.

* * * * *

UNITED STATES PATENT AND TRADEMARK OFFICE
CERTIFICATE OF CORRECTION

PATENT NO. : 7,718,991 B2  Page 1 of 1
APPLICATION NO. : 11/751990
DATED : May 18, 2010
INVENTOR(S) : Gerald H. Negley It is certified that error appears in the above-identified patent and that said Letters Patent is hereby corrected as shown below:

Column 13

*Line 5*: please add --of-- after "surface"

Signed and Sealed this

Third Day of August, 2010

David J. Kappos
*Director of the United States Patent and Trademark Office*